United States Patent [19]
Kim et al.

[11] Patent Number: 5,235,224
[45] Date of Patent: Aug. 10, 1993

[54] CURRENT DETECTING CIRCUIT USING PULSE TRANSFORMER

[75] Inventors: Hyo Gyu Kim, Suweon City; Dong Il Kim, Seoul, both of Rep. of Korea

[73] Assignee: Samsung Electronics Co., Ltd., Suweon City, Rep. of Korea

[21] Appl. No.: 780,777

[22] Filed: Oct. 23, 1991

[30] Foreign Application Priority Data

Oct. 31, 1990 [KR] Rep. of Korea .................. 90-17541

[51] Int. Cl.$^5$ .................. H03K 17/61; H03K 5/22
[52] U.S. Cl. .................. 307/572; 307/255; 307/257; 307/282; 307/364; 328/167
[58] Field of Search .............. 307/572, 573, 255, 257, 307/261, 282, 364, 542, 543, 555, 556, 644, 645, 648; 328/167

[56] References Cited

U.S. PATENT DOCUMENTS

| | | | |
|---|---|---|---|
| 3,334,316 | 8/1967 | Price | 307/282 |
| 3,858,057 | 12/1974 | Martins | 307/254 |
| 4,136,288 | 1/1979 | Knapp-Ziller et al. | 307/240 |
| 4,163,159 | 7/1979 | Bachle et al. | 307/255 |
| 4,194,160 | 3/1992 | Loucks | 328/267 |
| 4,349,752 | 9/1982 | Forte | 307/255 |
| 4,412,141 | 10/1983 | Jacobsen | 307/255 |
| 4,482,817 | 11/1984 | Brightman et al. | 307/257 |

FOREIGN PATENT DOCUMENTS 0028835 3/1977 Japan .................. 307/257
0193819 11/1982 Japan .

Primary Examiner—William L. Sikes
Assistant Examiner—Terry D. Cunningham
Attorney, Agent, or Firm—Burns, Doane, Swecker & Mathis

[57] ABSTRACT

A detecting circuit is provided with at least one transformer, in which a first transformer is connected at its primary winding to an input power source and has two windings at its output portion to control the operation of two transistors respectively mounted in two switching portions in turn, the detecting resistor is coupled to the first transformer to detect a changing amount of current applied to a load, and a second transformer is provided with two input windings having a tap connected to the resistor and two output windings facing to the input windings, thereby outputting the signals isolated from the ground.

8 Claims, 3 Drawing Sheets

CURRENT DETECTING CIRCUIT USING PULSE TRANSFORMER

FIELD OF INVENTION

The invention is related to a transformer driving circuit for switching transistors, and particularly to a detecting circuit using at least one pulse transformer for switching transistors, to remove the ground noises as well as for detecting an amount of current which is changed at the power source related to a load to be controlled.

PRIOR ART

The transformer driving circuit for switching transistors is illustrated in FIG. 3. The transformer $PT_3$ is provided with two windings $L_{31}$ and $L_{32}$ at the primary side and a winding $L_{33}$ at the secondary side.

Winding $L_{31}$ is connected at its middle tap to a power source $V_C$, at one terminal to transistor $Q_5$ which has its emitter grounded and at the remaining terminal to transistor $Q_6$ which has its emitter grounded. The winding $L_{32}$ has a middle tap grounded through a resistor $R_3$, is connected at one terminal through diode $D_1$ to the collector of transistor $Q_3$ which has its emitter grounded, and is coupled at the remaining terminal through diode $D_2$ to the collector of transistor $Q_4$ which has its emitter grounded. The winding $L_{33}$ is connected at one terminal to the base of Darlington transistor $Q_2$ and connected at the remaining terminal through a resistor $R_1$ to the collector of a transistor $Q_7$, in which the remaining terminal is coupled through resistor $R_2$ to the base of a transistor $Q_7$. The transistor $Q_7$ has the collector connected to the base of the transistor $Q_2$ and the emitter connected through a diode $D_3$ to the remaining terminal of the winding $L_{33}$ and through an electrolysis condenser $C_1$ to the emitter of the transistor $Q_2$.

Therefore, the transformer $PT_3$ provides isolated base drive for the high-speed high-power Darlington transistor $Q_2$. When the secondary winding switches positive, the condenser $C_1$ charges rapidly, after which base drive current is maintained at a level determined by the base-emitter of the transistor $Q_2$ and the value of the resistor $R_1$. When turned off, the transformer secondary winding goes to zero due to the shorting of the transformer primary winding by transistors $Q_3$ and $Q_4$. The base of the transistor $Q_7$ is then forward-biased by the condenser $C_1$ and turned on, discharging the condenser $C_1$ through the base-emitter path of the transistor $Q_2$. As a result, the paired transistors $Q_5$ and $Q_6$ and the paired transistors $Q_3$ and $Q_4$ are alternately turned on/off to switch the transistor $Q_7$, so that the condenser $C_1$ is charged or discharged. The Darlington transistor $Q_2$ is then turned on/off to provide the isolated ground to the power source of the load. But, the transformer drive circuit fails to maintain the Fail-Safe aspect of the system associated with the voltage fluctuation of the power source.

In connection with the Fail-Safe aspect of the system, Japanese Laid-Open Patent Publication No. Sho. 57-193819 discloses a switching regulator. The switching regulator is so constructed that paired transistors are alternately turned on/off according to their base inputs. Thus the primary winding of a transformer is maintained positive or negative in turn at both terminals, the secondary energized voltage at the secondary winding is rectified to obtain direct current, while the pulse width of the base input is controlled corresponding to the value of the output detected by a pulse width modulator, a change in increasing or reducing of the input to the pulse width modulator corresponding to the value of the detected output voltage is released by a time constant circuit.

The switching regulator is a circuit supplying the power source to the load with its ground not being separated from the load. This patent publication does not discuss resolving the ground noise that may cause the problem in the high voltage circuit, in which the ground noise includes the noises generating at resistor elements connected to an amplifier in the system.

As described above, a high voltage circuit provided with a high voltage source using the high current and a control portion for a load has often controlled the larger current of the high voltage circuit at the control portion. However, in the event the larger current flowing through the high voltage circuit is inadvertently introduced into the control portion, it either malfunctions or is broken.

In light of these points, if the ground of a power source is separated from that of a load and a control portion to assure the system safety, the reliability of the appliance increases. In particular, when it is adapted to an A.C. drive motor, the accurate load control is successfully verified.

On the other hand, when the control of an A.C. drive motor is accompanied by a Hall sensor to provide the isolated ground to a control portion, it is known that the control portion is limited in using the larger current due to the disadvantage that the Hall sensor cannot increase its consuming current.

Accordingly, it is an object of the invention to provide a detecting circuit using at least one pulse transformer for switching transistors, which is separated from the ground to remove the ground noises as well as for detecting an amount of current, which is changed at the power source, related to a load to be controlled.

It is another object of the invention to provide a detecting circuit using at least one pulse transformer for switching transistors, which is separated from the ground to remove the ground noises, thereby enhancing the reliability of the control to a load.

It is also another object of the invention to provide a detecting circuit using at least one pulse transformer for switching transistors, for detecting an amount of current delivered to a load while being separated from the ground.

It is also another object of the invention to provide a detecting circuit using at least one pulse transformer for switching transistors, for separating the switching transformer from the ground to remove the ground noises as well as for detecting an amount of current which is changed at the power source related to a load to be controlled. This prevents failure of the system and maintains the reliability of the system operation.

SUMMARY OF INVENTION

The invention is provided with at least one pulse transformer and comprises a first means including a primary winding connected to an input side and at least one secondary winding having at least two outputs; a first switching portion including at least one switching means connected to one output of the secondary winding to alternately be turned on/off; a detecting means connected to the output of the switching means to detect an amount of current variation applied to a load; a second means provided with at least one primary winding having two inputs connected to the switching means of the first switching portion to be alternately operated and at least one secondary winding facing the primary winding to receive only the signals isolated from the ground by the energizing operation switched by itself; and a secondary switching portion provided with at least one switching means connected to each output of the secondary means to be alternately switched for outputting only the signals separated from the ground, in which the detecting means detects an amount of current which is changed at a power source to the load, and at least two transformers for switching at least one switching means generates the signals isolated from the ground, thereby assuring the safety of the system.

BRIEF DESCRIPTION OF INVENTION

The invention will be explained in detail below with reference to the accompanying drawings, in which.

DETAILED DESCRIPTION OF INVENTION

Figure 1:
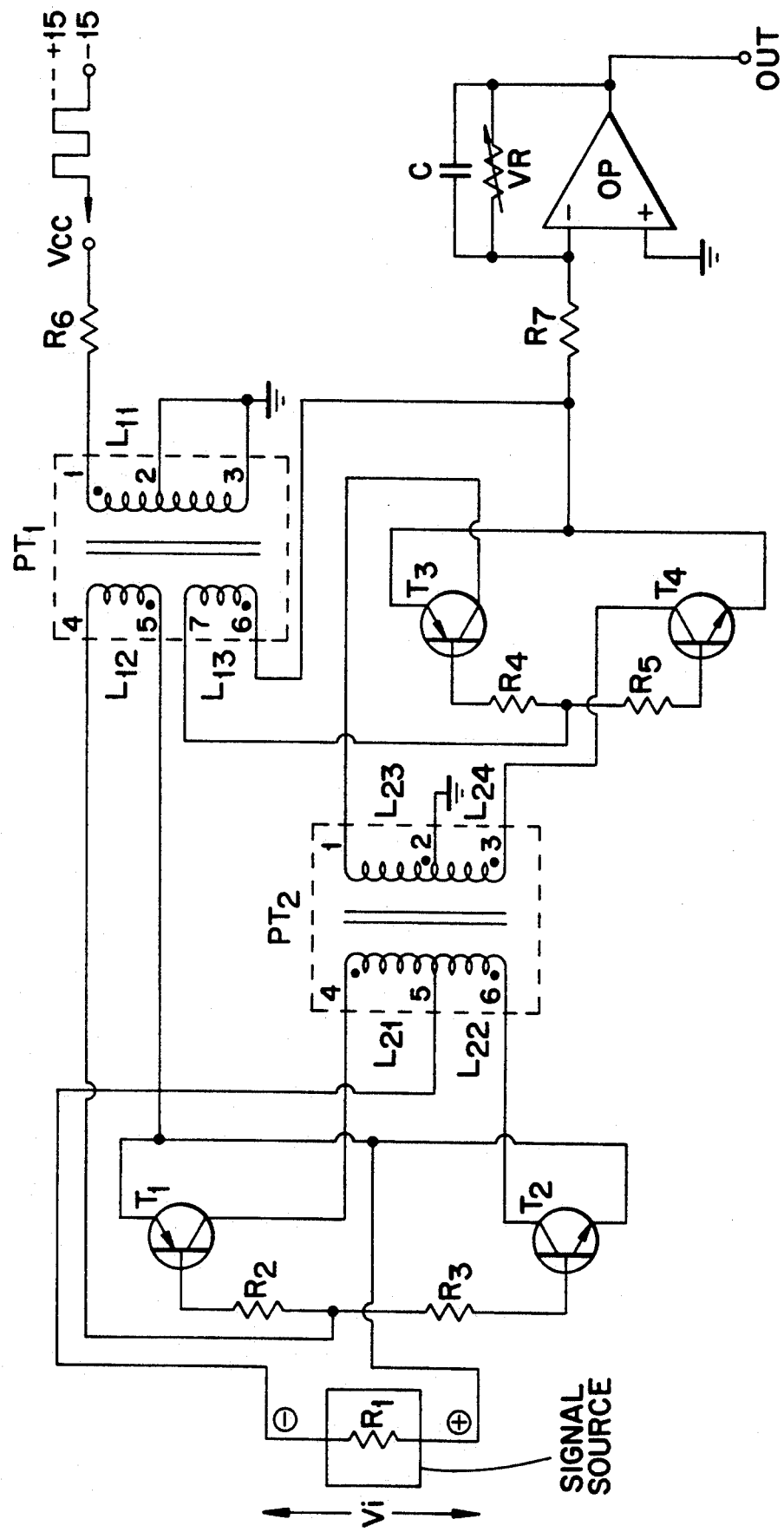
FIG. 1 is a detailed detecting circuit using at least one pulse transformer according to the invention.
Figure 2:
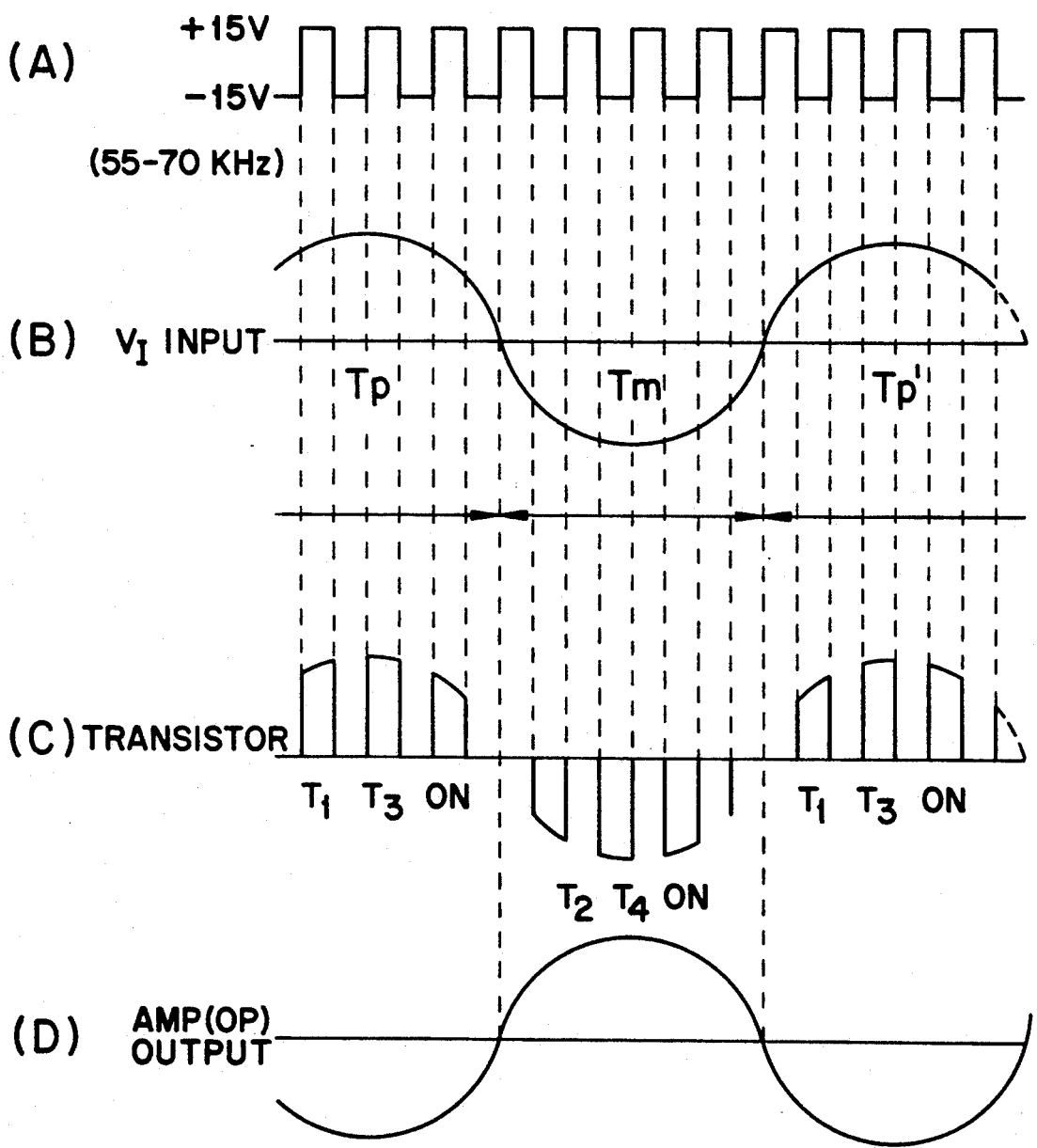
FIG. 2 is a waveform view showing the operation of a detecting circuit using at least one pulse transformer, according to the invention; and, FIG. 3 is a conventional transformer drive circuit for switching transistors.
Figure 3:
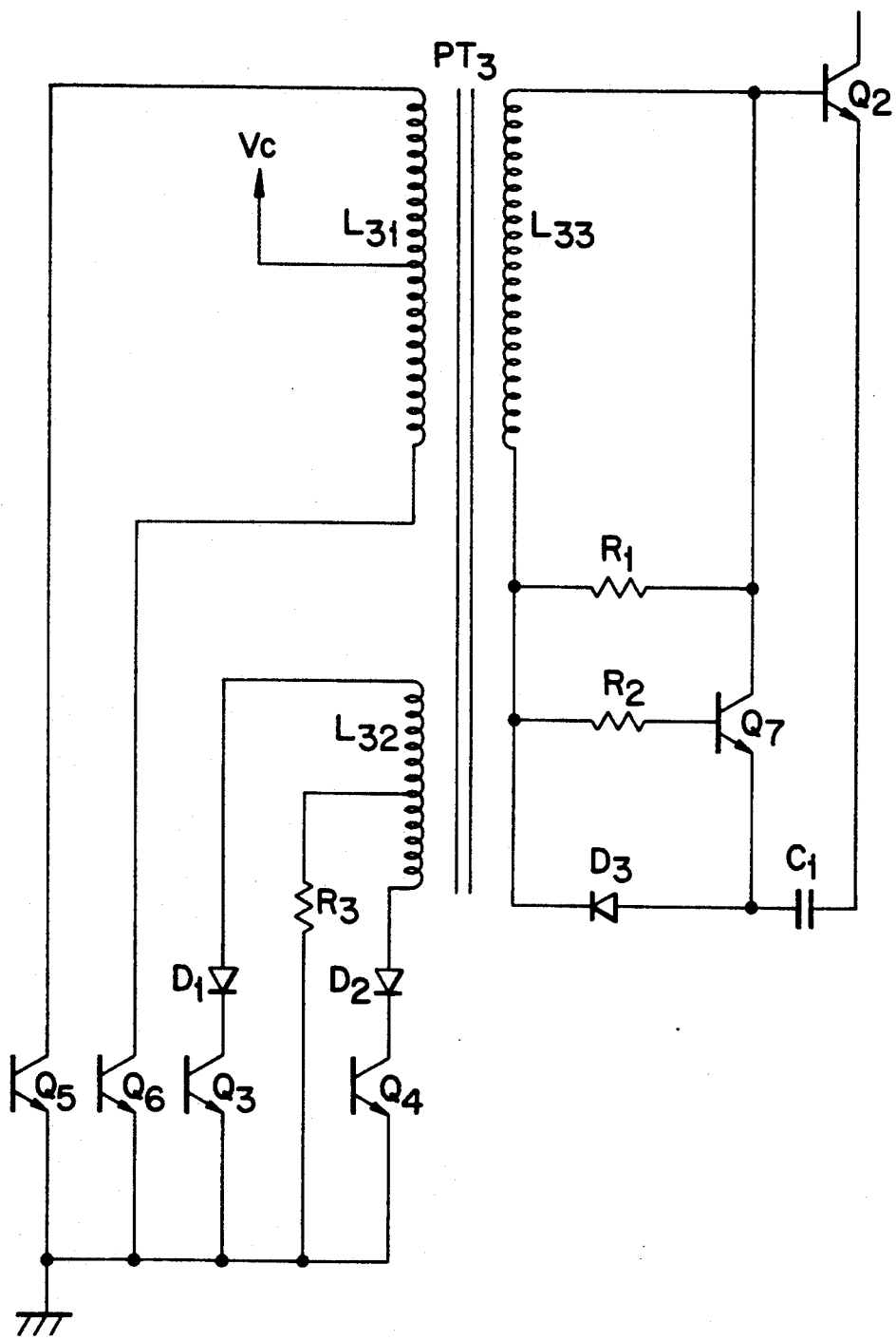

FIG. 1 illustrates a circuit using at least one pulse transformer, for switching transistors according to the invention, and FIG. 2 shows the waveforms related to the operation of FIG. 1.

A first pulse transformer $PT_1$ is provided with a primary winding $L_{11}$ having an input terminal connected through a resistor $R_6$ to a power source $V_{CC}$. A middle tap 2 and a terminal 3 of the first pulse transformer $PT_1$ are grounded, in common. The output portion of the transformer $PT_1$ is provided with two secondary windings $L_{12}$ and $L_{13}$, having terminals 4, 5 and 6, 7, respectively. The winding $L_{12}$ is connected to a first switching portion driven by the energization of windings $L_{12}$, the terminal 4 is connected between resistors $R_2$ and $R_3$, and the terminal 5 is coupled to the emitters of transistors $T_1$ and $T_2$. Also the winding $L_{13}$ is connected to a second switching portion (which will be described in detail below).

The first switching portion is provided with two transistors $T_1$ and $T_2$, the bases of which are respectively connected to the resistors $R_2$ and $R_3$. The emitter of the transistor $T_1$ is connected to a detecting resistor $R_1$ which represents the impedance with respect to a load, and also the emitter of the transistor $T_2$ is connected to one end of the resistor $R_1$ along with the transistor $T_1$. The resistor $R_1$ is connected to the common tap 5 of a secondary transformer $PT_2$.

The second transformer $PT_2$ is provided with two primary windings $L_{21}$ and $L_{22}$ having the common tap 5 and two secondary windings $L_{23}$ and $L_{24}$ having a common tap 2. Each of the collectors of the transistors $T_1$ and $T_2$ is coupled to the terminal of the winding $L_{21}$ and the terminal of the winding $L_{22}$, respectively. The common tap 2 of the windings $L_{23}$ and $L_{24}$ is grounded, and their terminals 1 and 3 are connected to a second switching portion.

The second switching portion is provided with transistors $T_3$ and $T_4$, the base of each being coupled to respective ends of resistors $R_4$ and $R_5$, which are connected at their other ends to each other. Each collector of transistors $T_3$ and $T_4$ is coupled to the terminals 1 and 3 of the secondary windings $L_{23}$ and $L_{24}$. The emitters of the transistors $T_3$ and $T_4$ are connected through a resistor $R_7$ to an amplifying portion also with a terminal 6 of the winding $L_{13}$.

The amplifying portion is provided with an operation amplifier OP, the inverting terminal of which receives a feedback from the output terminal by a condenser C and a variable resistor VR coupled in parallel to each other, and the non-inverting terminal of which is grounded.

The rectangular waveform signal may be applied to the innovative circuit from a power source $V_{CC}$ as shown in FIG. 2A, which is a sampling signal having the voltage of $+/-$ 15 V and the frequency of 55 to 70 KHz. When the signal is applied to the primary winding of the first transformer $PT_1$, the secondary windings $L_{12}$ and $L_{13}$ are energized in positive polarity from the terminal 5 to the terminal 4 or from the terminal 6 to the terminal 7, and vice versa. It provides the isolated ground signal to a load from the power source $V_{CC}$.

Specifically during the positive pulse period of FIG. 2A, the transistor $T_1$ is forward-biased to be turned on, and the transistor $T_2$ is turned off. At that time, a detecting resistor $R_1$ receives the positive polarity power generated at the terminal 5 of the secondary winding $L_{12}$. The input winding $L_{21}$ is driven with the terminal 4 being a positive polarity, and the resistor $R_1$ detects the positive signal of the input voltage VI at the interval $T_P$ of the waveform as shown in FIG. 2B.

Simultaneously, the positive pulse signal is also applied to the terminal 6 of the secondary winding $L_{13}$ in the transformer $PT_1$, the transistor $T_3$ is forward-biased to be turned-on, and the transistor $T_4$ is turned off. Thus, the transistors $T_1$ and $T_3$ generate the operation waveform as illustrated in FIG. 2C. The waveform signal C is applied through the resistor $R_7$ to the operation amplifier OP, so that it passes through a low filter including the condenser C and the variable resistor VR to generate the signal the same as the waveform of FIG. 2D.

On the contrary, during the negative pulse period of FIG. 2A, the transistor $T_1$ is turned off, and the transistor $T_2$ is forward-biased to be turned on. The detecting resistor $R_1$ reflects a negative polarity signal which is generated at the interval TM of the waveform as shown in FIG. 2B. The signal is polarity-inverted at the resistor $R_1$ to energize the secondary winding $L_{22}$.

Also, the positive signal at the terminal 6 of the secondary winding $L_{13}$ in the transformer $PT_1$ turns on the transistor $T_4$ and turns off the transistor $T_3$. Thus, the transistors $T_2$ and $T_4$ generate the operation waveform as illustrated in FIG. 2C. The waveform signal C is applied through the resistor $R_7$ to the operation amplifier OP, so that it passes through a low filter including the condenser C and the variable resistor VR to generate the signal the same as the waveform of FIG. 2D.

As a result, the transformer $PT_1$ generates the ground isolated signal to remove the ground noises to a load. A detecting resistor $R_1$ can detect the voltage by the current flowing across it, so that the voltage fluctuation of an A.C. power source to a load is determined. Also, because both ends of the resistor $R_1$ can be artificially changed into a positive terminal or a negative terminal, the output voltage of an operation amplifier OP having a polarity the same as that of an input voltage $V_1$ to the load may be obtained to adapt to the automatic control circuit.

What is claimed is:

1. A detecting circuit comprising
means for providing a pulsed signal;
means for providing an input signal having polarity and magnitude;
a transformer including a primary coil and a secondary coil;
means for providing an output signal from said detecting circuit;
first switching means, connected to receive said pulsed signal from said pulsed signal providing means and said input signal, for selectively applying said input signal to said primary coil of said transformer in accordance with said pulsed signal and said input signal; and
second switching means, connected to said secondary coil and connected to receive said pulsed signal from said pulsed signal providing means, for selectively applying an output of said secondary coil to said means for providing an output signal in accordance with said pulsed signal.

2. A detecting circuit according to claim 1, wherein said first switching means includes a first and a second switch each capable of changing switch state in accordance with the pulsed signal wherein only said first switch changes its switch state when said input signal has one polarity and only said second switch changes state when said input signal has another polarity.

3. A detecting circuit according to claim 2, wherein said second switching means includes a third and a fourth switch each capable of changing switch state in accordance with the pulsed signal wherein said third switch applies the output of said secondary coil to said means for providing an output signal when said first switch applies said input signal to said primary coil of said transformer and said fourth switch applies the output of said secondary coil to said means for providing an output signal when said second switch applies said input signal to said primary coil of said transformer.

4. A detecting circuit according to claim 3, wherein said means for providing a pulsed signal includes a pulse transformer comprising at least one primary coil for receiving a pulse signal and a first and a second secondary coil respectively connected to said first and second and said third and fourth switches.

5. A detecting circuit according to claim 2, wherein said first and second switches are transistors, emitters of which are commonly connected to said means for providing an input signal.

6. A detecting circuit according to claim 3, wherein said third and fourth switches are transistors, emitters of which are commonly connected to said means for providing an output signal.

7. A detecting circuit according to claim 1, wherein said means for providing an output signal comprises an amplifier with a feedback circuit.

8. A detecting circuit according to claim 1, wherein said means for providing an input signal comprises a resistor which represents an impedance with respect to a load.

* * * * *